(12) United States Patent
Nurmi

(10) Patent No.: US 6,608,251 B1
(45) Date of Patent: Aug. 19, 2003

(54) PROTECTING DEVICE AGAINST INTERFERING ELECTROMAGNETIC RADIATION COMPRISING EMI-GASKETS

(75) Inventor: Reijo Nurmi, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/018,044

(22) PCT Filed: Jun. 22, 2000

(86) PCT No.: PCT/FI00/00570
§ 371 (c)(1),
(2), (4) Date: Feb. 4, 2002

(87) PCT Pub. No.: WO01/01745
PCT Pub. Date: Jan. 4, 2001

(30) Foreign Application Priority Data

Jun. 24, 1999 (FI) .................................................. 991454

(51) Int. Cl.[7] .............................................. H05K 9/00
(52) U.S. Cl. ................................ 174/35 GC; 174/35 R; 361/816; 361/752; 277/920
(58) Field of Search ........................ 174/35 GC, 35 R; 277/920; 361/752, 753, 800, 816, 818

(56) References Cited

U.S. PATENT DOCUMENTS

| | | | |
|---|---|---|---|
| 3,011,775 A | 12/1961 | MacLeod | 267/167 |
| 3,502,784 A | 3/1970 | Kunkel | 174/35 GC |
| 3,505,463 A | * 4/1970 | McAdams | 174/35 GC |
| 3,904,810 A | 9/1975 | Kraus | 174/35 GC |
| 4,529,257 A | 7/1985 | Goodman et al. | 439/271 |
| 4,564,722 A | 1/1986 | Nordin | 174/35 GC |
| 4,572,921 A | 2/1986 | May et al. | 174/35 GC |
| 4,780,570 A | 10/1988 | Chuck | 174/35 GC |
| 4,788,381 A | 11/1988 | Nilsson | 174/35 GC |
| 4,929,802 A | 5/1990 | Schaepers et al. | 174/35 MS |
| 5,029,254 A | 7/1991 | Stickney | 174/35 GC |
| 5,091,606 A | 2/1992 | Balsells | 174/35 |
| 5,134,244 A | 7/1992 | Balsells | 174/35 GC |
| 5,223,670 A | 6/1993 | Hogan et al. | 174/35 MS |
| 5,313,016 A | 5/1994 | Brusati et al. | 174/35 GC |
| 5,474,309 A | 12/1995 | Balsells | 277/651 |
| 5,502,784 A | 3/1996 | Rondeau | 385/66 |
| 5,545,843 A | 8/1996 | Arvidsson et al. | 174/35 |
| 5,581,048 A | 12/1996 | Shores | 174/35 GC |
| 5,603,514 A | 2/1997 | Jencks et al. | 174/35 GC |
| 5,770,822 A | 6/1998 | Abolitz et al. | 174/35 GC |
| 5,885,118 A | 3/1999 | Billenstein et al. | 439/862 |
| 6,182,835 B1 | 2/2001 | Chen | 211/13.1 |

FOREIGN PATENT DOCUMENTS

| | | | |
|---|---|---|---|
| CH | 668 527 | 10/1985 | ............ H05K/9/00 |
| DE | 1849258 | 4/1962 | |
| DE | 197 01 690 | 7/1998 | |
| EP | 0477 628 A1 | 9/1991 | |
| EP | 0 889 686 | 6/1998 | ............ H05K/9/00 |
| GB | 1 505 579 | 3/1978 | |
| GB | 2 222 913 A | 3/1990 | |
| JP | 56-158202 | 12/1981 | |
| JP | 10-173382 | 6/1998 | ............ H05K/9/00 |
| WO | WO 94/30035 | 12/1994 | |

* cited by examiner

*Primary Examiner*—Hung V. Ngo
(74) *Attorney, Agent, or Firm*—Cohen, Pontani, Lieberman & Pavane

(57) ABSTRACT

The object of the invention is a device and an elongated EMI gasket (20), made from an electroconductive wire, used for its EMI screening (electromagnetic interference). It is characteristic of the EMI gasket that it comprises a groove substantially parallel to the longitudinal direction of the EMI gasket for receiving a piece or its part (43) inside the EMI gasket (20). The piece to be protected against interfering electromagnetic radiation is EMI screened by pushing the EMI gasket (20) against the edge of the piece and by arranging contacts through the EMI gasket between the piece and some electroconductive surface that is close to it.

13 Claims, 6 Drawing Sheets

PROTECTING DEVICE AGAINST INTERFERING ELECTROMAGNETIC RADIATION COMPRISING EMI-GASKETS

PRIORITY CLAIM

This is a national stage of application No. PCT/FI00/00570, filed on Jun. 22, 2000. Priority is claimed on that application and on the Application No. 991454, filed in Finland on Jun. 24, 1999.

FIELD OF THE INVENTION

The present invention relates to protecting devices against interfering electromagnetic radiation.

BACKGROUND OF THE INVENTION

Electromagnetic radiation generated in a device may disturb either the device's own operation or the operation of some external device. Generally, the aim is to protect sensitive devices and interfering sources of electromagnetic radiation against radiation by encasing them in packages made from a conductive material and by sealing the packages so tight that no interfering electromagnetic radiation can penetrate the package. This type of or similar protection of devices against electromagnetic radiation is called EMI (electromagnetic interference) shielding.

One problematic area in EMI shielding is the sealing of junctions and joint surfaces comprised by devices, device cabinets and boxes. If the joint surfaces are not properly sealed with EMI gaskets, interfering electromagnetic radiation will quite easily pass through the joint. The best protection against interference is achieved when the joint surfaces are tightly sealed together galvanically. This means that resistance between the joint surfaces, so-called 'junction resistance', is as low as possible. However, it is difficult and expensive to manufacture such plane-like joint surfaces, where the surfaces are tightly attached to each other in every place galvanically. Therefore, solutions in which a good contact between the joint surfaces is not formed in every place but at certain distances along the whole length of the joint, are used for sealing joint surfaces. When the distance between the contacts formed is sufficiently short, electromagnetic radiation can no longer penetrate the joint in disturbing quantities. A sufficient contact distance depends on the frequency of the interfering radiation and the required attenuation level. Mechanical properties and the available space also affect the contact distance used. In connection with device cabinets and racks, a typical contact distance can be, e.g. 5–15 mm.

EMI sealing is required in various types of electric devices. Among others, EMI gaskets are used in device box and cabinet doors and apertures, as well as in partitions between different units inside device cabinets.

There are at least three types of gaskets that are most commonly used for EMI sealing. In one solution, a mantle is knitted from a conductive material around a resilient rubber compound or some other corresponding material. The mantle is knitted from a very thin wire that acts as a conductive fabric. When placed in between joint surfaces, these types of gaskets give an even contact but do not necessarily give a sufficient contact for EMI shielding due to the large contact area. They do not pierce through the surface, which is slightly oxidised or greasy. These types of gaskets may shed short pieces of wire, which can cause a short circuit after being passed on to a printed board. Neither do they endure friction and continuous wear.

In a second solution conductive particles are mixed inside a rubber-like sealing compound, the conductive particles forming a galvanic connection between joint surfaces when the joint surfaces are pressed together. However, the electroconductivity of these types of gaskets does not come near to that of, e.g. copper alloyed gaskets. Furthermore, the properties of these types of gaskets may change as they age.

A third solution is provided by spring-like gaskets bent from sheet metal. Their electroconductivity is good, but their manufacture is problematic. The manufacture of spring-like sheet metal gaskets requires expensive perforating and bending tools. In addition, the edges of the gaskets are sharp, whereupon one may hurt one's hand on them, and the length of the gaskets is limited to the length of the sheet used in their manufacture, which normally is about 70 cm, in which case a full-length gasket must be assembled from several pieces.

The most significant disadvantage of a spring-like sheet metal gasket is, however, its susceptibility to being damaged due to its poor elastic properties. The gasket has extremely accurate tolerance of compression. If joint surfaces are pressed together too little, the gasket placed in between them will leak, as it is called, i.e. let electromagnetic radiation significantly through it. If again joint surfaces are pressed too much, a permanent deformation will take place in the gasket and its compression force will no longer be sufficient. Also in this case, the joint will begin to leak.

FIG. 1 illustrates an EMI gasket presented in the Patent Publication U.S. Pat. No. 5,091,606, which comprises a helical spring made from a circular profiled wire and may comprise a layer made on top of the spring from a conductive and ductile material. When this type of gasket is placed in between the surfaces to be sealed and the surfaces are pressed against each other, a contact is formed between the surfaces. The gasket is intended for sealing shafts and other surfaces with a circular cross-section, and their circumferences. A disadvantage of these types of gaskets is a reasonably complex manufacturing process, as well as the difficulty of fitting the gasket into small spaces. In addition, it is difficult to attach and get it stay in its place in structurally difficult joining points.

SUMMARY OF THE INVENTION

Now, EMI sealing has been invented, which is particularly well suited, e.g. for the EMI shielding of device cabinet partitions, shoulders, printed boards and other similar type of pieces and parts of the pieces. It is characteristic of an elongated EMI gasket, of the invention, manufactured from an electroconductive wire that the EMI gasket comprises a groove substantially parallel to its longitudinal direction for receiving a piece or a part of the piece inside the EMI gasket.

Correspondingly, it is characteristic of a device according to the invention, the device comprising a first part and a second part, joined together, and an elongated EMI gasket for getting said first part and said second part into contact and for preventing electromagnetic interference from penetrating a joining point between the first and second parts, that the EMI gasket comprises a groove substantially parallel to the longitudinal direction of the EMI gasket for receiving at least one of said first and second parts inside the EMI gasket and that the EMI gasket is in contact with both said first part and said second part for forming an electric contact through the EMI gasket between said parts.

It is characteristic of a second device according to the invention, the device comprising a first part, a second part and a third part, joined together, and in between them an elongated EMI gasket, made from an electroconductive wire, for getting said parts into contact with each other and for preventing electromagnetic interference from penetrating the joining points between said parts, that the EMI gasket is in contact with said first part and said second part, and that the EMI gasket comprises a groove substantially parallel to the longitudinal direction of the EMI gasket for receiving said third part at least partly inside the EMI gasket and that said groove is bordered by a first edge, which is in contact with said third part for forming an electric contact between said first part; said second part and said third part.

In accordance with the invention, the EMI gasket is made from a spring-like electroconductive wire that is bent in the appropriate shape depending on the use, however, so that it comprises a groove substantially parallel to the longitudinal direction of the EMI gasket, from where a piece to be EMI sealed can at least partly penetrate inside the EMI gasket. The piece to be protected against interfering electromagnetic radiation is EMI shielded by pushing the EMI gasket to the edge of the piece and by arranging contacts via the EMI gasket between the piece and some electroconductive surface that is close to it.

Other objects and features of the present invention will become apparent from the following detailed description considered in conjunction with the accompanying drawings. It is to be understood, however, that the drawings are intended solely for purposes of illustration and not as a definition of the limits of the invention, for which reference should be made to the appended claims.

BRIEF DESCRIPTION OF THE DRAWINGS

In the following, the invention will be explained in detail by referring to the enclosed drawings, in which.

DETAILED DESCRIPTION OF THE PRESENTLY PREFERRED EMBODIMENTS

Figure 1:
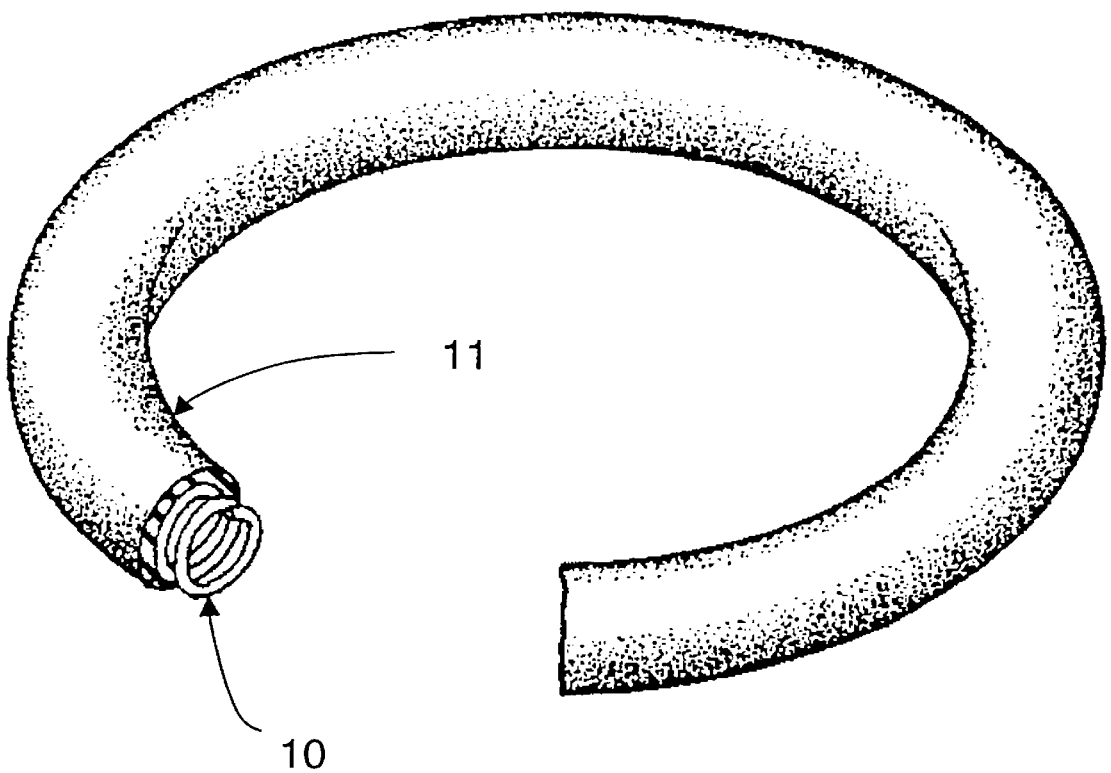
FIG. 1 shows an EMI gasket according to prior art.
Figure 2A:
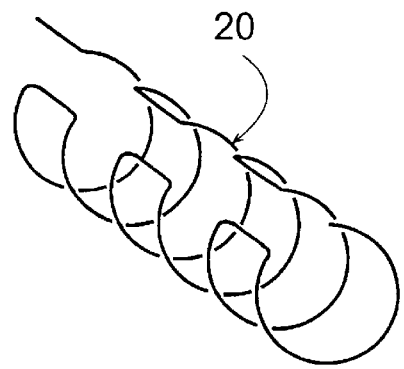
FIGS. 2a–2c show one way of EMI sealing a component package partition according to the invention.
Figure 2B:
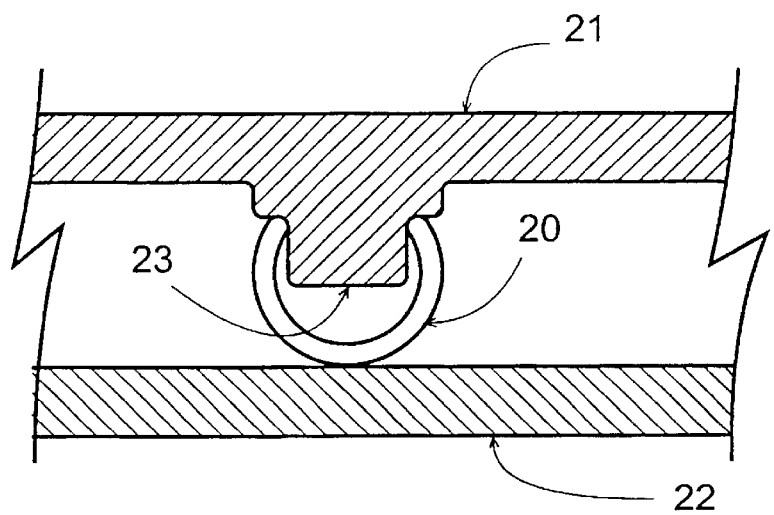
Figure 2C:
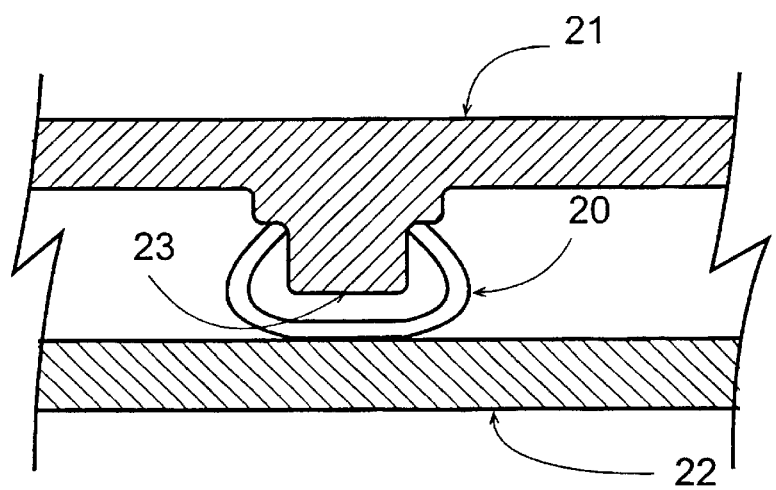

FIG. 1 was described above in connection with the description of prior art. FIGS. 2a and 2c are related to a first embodiment according to the invention, in which a device cabinet partition is sealed EMI tight. Here, by the device cabinet is meant all types of packages used for protecting devices, the external dimensions of which may typically vary from some tens of millimeters to a few meters. An EMI gasket 20 used for sealing can be made, e.g. by winding a sealing wire with a circular profile in turn for a specific first length clockwise and counter-clockwise around the longitudinal axis of the gasket 20. Always when the direction of winding changes, the sealing wire is allowed to run parallel to the longitudinal axis of the gasket 20 for a specific second length. In this way, it is possible to make the elongated helical spring-like EMI gasket 20 according to the invention (FIG. 2a), the cross direction profile of which is open, preferably in the shape of a circular arc. The EMI gasket 20 comprises a groove parallel to the longitudinal direction of the gasket for receiving an edge of the piece to be EMI shielded inside the gasket 20. Alternatively, the cross direction profile of an EMI gasket according to the invention can also be bent in other usable shapes, e.g. in the shape of a square where one side of the square is at least partly open.

Typically, a device cabinet (FIG. 2b) to be sealed is made from an electroconductive material, such as a die-casting aluminium alloy, and it comprises a first part 21 comprising a shoulder 23, which can be, e.g. a partition of a cabinet, and a second part 22, which is typically not shouldered. Said second part 22 can be, e.g. a part of the body of the device cabinet or a printed board in the cabinet.

Typically, the partition 23 separates from each other in an electronic device two blocks that have different functions, which nevertheless belong to the same body structure, i.e. the same unit. EMI sealing is required between the blocks in order that the different blocks would not interfere with each other, e.g. due to their radio frequency (RF) radiation. Typical such blocks are, e.g. low-frequency and high-frequency parts, analog and digital parts, as well as process units. Said devices can be, e.g. devices in a mobile communication network. They can be located, e.g. in a base transceiver station of the mobile communication network.

The penetration of interfering electromagnetic radiation from one side of the shoulder 23 to the other side is prevented by placing the EMI gasket 20 that comprises a groove parallel to the longitudinal direction of the gasket between the shoulder 23 and said second part 22 so that the shoulder 23 is pressed partly inside the gasket 20, and by pressing said first part 21 and said second part 22 of the cabinet against each other. This being the case, the edges that border said groove come into strong contact with the shoulder 23 and the part of the gasket that is opposite to the opening of the groove with the surface of the second part 22 of the device cabinet, whereupon a compression is produced on the EMI gasket 20 (FIG. 2c).

The elastic forces that act in the compressed gasket 20 tend to return the gasket into its original shape, whereupon the flexible gasket 20 presses tightly against the second part 22 of the cabinet and the shoulder 23 comprised by the first part 21. This being the case, firm electric contacts are formed between said first and second parts, joined together, at close, regular distances preventing electromagnetic radiation from penetrating the joint.

Typically, partitions wind inside the cabinet bordering different-sized compartments. In order that the structure to be sealed would be EMI tight, the EMI gasket 20 must run along the whole length of the joint, and wind accordingly.

The gasket 20 can be made from several different materials, e.g. from alloyed copper metal, stainless steel or other corresponding material. The gasket's electrical and mechanical properties, as well as manufacturability, can be affected by the selection of the sealing material. The diameter of the wire used for the manufacture of the gasket 20 may vary, but it is typically approximately 0.3–5 mm. The diameter of the gasket 20 can be, e.g. 2–40 mm. The pitch of thread can be, e.g. 1–15 mm. The sealing wire is bent in the required shape by a spring-making machine designed for bending wire material.

Figure 3A:
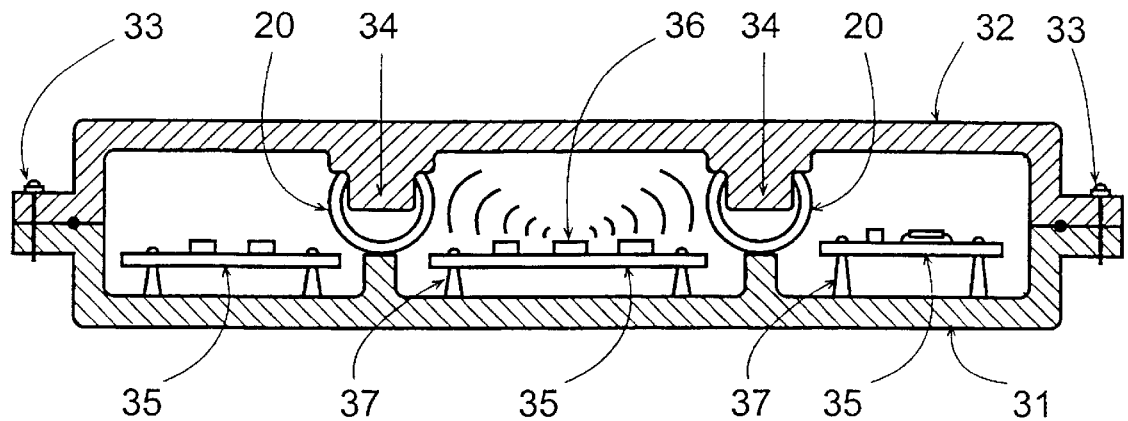
FIGS. 3a–3b show the EMI sealing of a component package compartment according to the invention.
Figure 3B:
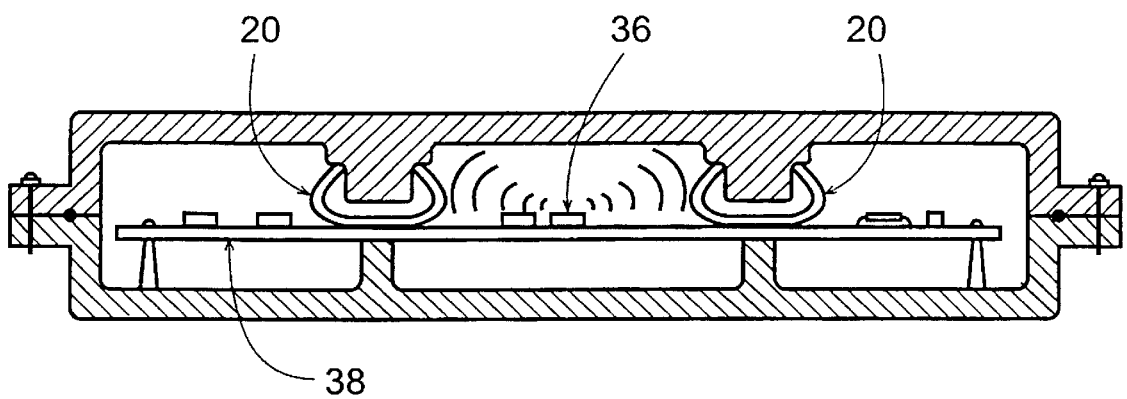

FIGS. 3a and 3b illustrate how a whole device cabinet compartment is EMI sealed from its environment. FIG. 3a shows a device cabinet comprising three compartments made from an electroconductive material. The body of the device cabinet comprises two different halves: a first half 32 and a second half 31, which are joined together, e.g. with screws 33. With the help of a shouldered partition 34, the body borders inside the device cabinet three compartments, which have printed boards 35 attached to the body 31 of the device cabinet with screws, with the help of elevation pins 37. On the printed board, in the centre cabinet compartment, there is an interfering source 36 of electromagnetic radiation. According to the invention, electromagnetic radiation, produced in the centre compartment of the device cabinet, is prevented from penetrating into the other compartments by EMI sealing according to the first embodiment of the invention, in which the EMI gaskets 20 presented in the first embodiment are installed compressed on the partitions 34 of the device cabinet.

FIG. 3b differs from the case presented in FIG. 3a in that there separate printed boards 35 of the compartments are replaced by a single common printed board 38, which extends to all three compartments. This being the case, the EMI gaskets press the conductive surface on the printed board 38, which must be in ground potential for achieving EMI tightness, i.e. in the same potential as the body of the cabinet.

Figure 4A:
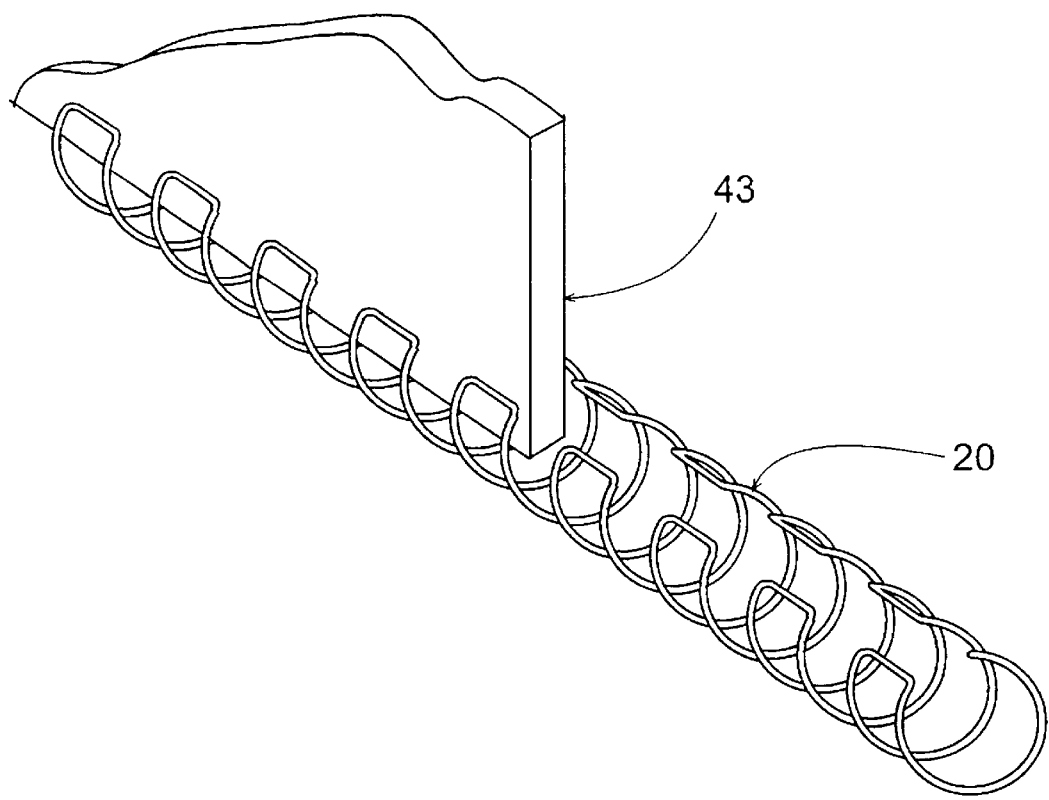
FIGS. 4a–4b show a second embodiment of EMI sealing according to the invention.
Figure 4B:
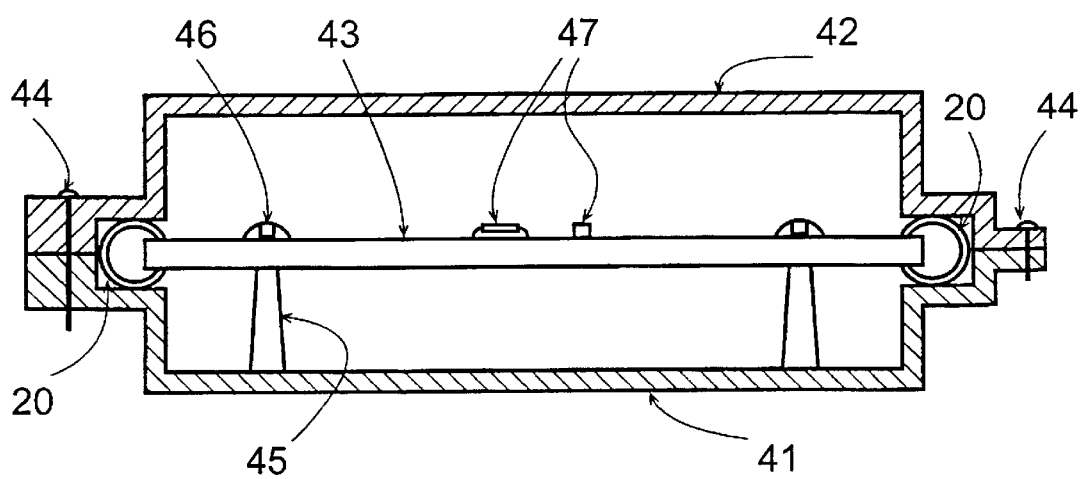

The EMI gasket 20 presented in the first embodiment is well suited for being installed on the edge of different types of boards, e.g. printed boards 43 (FIG. 4a). FIG. 4b illustrates the second embodiment according to the invention, in which a device cabinet comprising the printed board 43 is EMI sealed. The body of the device cabinet comprises a first part 41 and a second part 42, which can be joined together, e.g. with screws 44. Said first part 41 comprises elevation pins 45 with the help of which the printed board 43 can be attached to the body of the cabinet with screws 46. On the surfaces of the printed boards 43 that point towards said first part 41 and said second part 42 of the cabinet, there is preferably located as ground plane an electroconductive area, which can be made, e.g. from electroconductive metal film; foil. On the surfaces of the printed board, there can be electric components 47.

For achieving EMI tightness, the EMI gasket 20 is first pushed on to the edge of the printed board 43 and the printed board with the gasket is placed in the cabinet so that part of the EMI gasket 20 leans against the corner of said first part 41 of the cabinet. After this, the second part 42 of the cabinet is matched together with said first part 41 and said parts 41, 42 are pressed together, e.g. with the screws 44. This being the case, the EMI gasket, which is in a recess produced between said parts 41, 42, compresses and the gasket 20 is pressed tightly against the surfaces of said first part 41 and said second part 42 of the cabinet. The parts of the EMI gasket 20 that border the groove that is parallel to the longitudinal direction of the gasket 20 press against an electroconductive area located on the surface of the printed board 43. This being the case, electric contacts are formed at close, regular distances between said cabinet parts 41, 42 and the ground plane of the printed board 43, whereupon the penetration of interfering electromagnetic radiation into and out of the cabinet is prevented. The penetration of radiation inside the cabinet from one side of the printed board to the other side is also prevented.

Figure 5A:
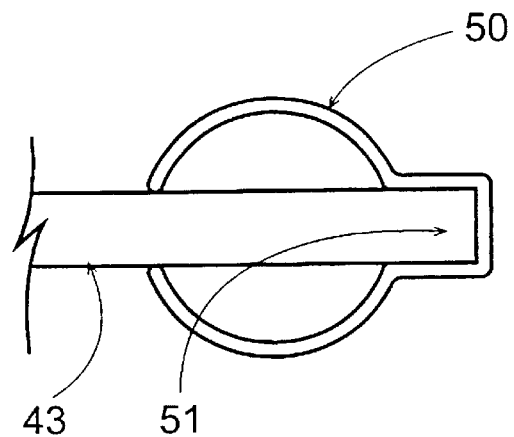
FIGS. 5a–5b show a third embodiment of EMI sealing according to the invention.

An EMI gasket 50 can also be made so that a recess 51, adapted for the edge of the printed board, is bent in the part of the gasket that is opposite to the opening of the gasket 50, whereupon the gasket follows better the edge of the printed board 43 (FIG. 5a). The edges of said recess 51 preferably touch the edging parts of the printed board 43. This being the case, the printed board 43 attaches more effectively to the gasket 50 and there are more contact points between the gasket and the board. One advantage of this structure is also that if, for example, the gasket is pressed from one side of the printed board 43 more than from the other side or if it is only pressed from one side of the printed board 43, the gasket 50 will keep its shape well and not tend to twist in relation to the edge of the printed board 43.

Figure 5B:
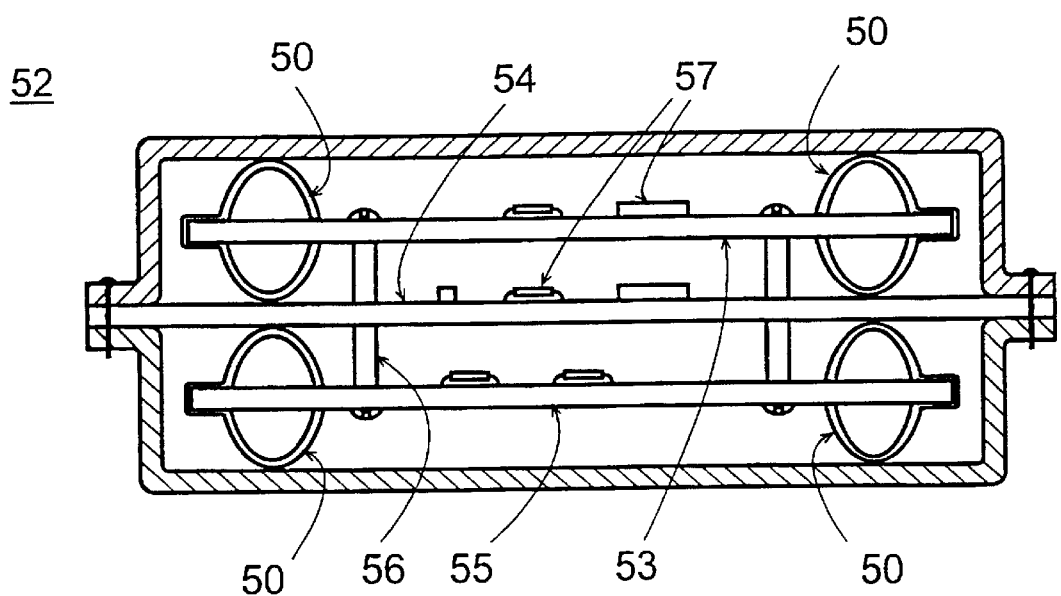

It is often appropriate, for example, due to space limitations that a plurality of printed boards are located in the same device cabinet. In this case, besides the EMI shielding of the whole cabinet, it must also be seen to it that the printed boards, typically stacked on top of each other in the cabinet, do not interfere with each other due to electromagnetic radiation. FIG. 5b illustrates the third embodiment according to the invention, in which three printed boards 53–55, stacked on top of each other in a device cabinet, are EMI insulated from each other. The body of the device cabinet 52 comprises two parts between which the middle one 54 of the printed boards reaches. The printed boards 53–55 are attached to each other through intermediate bushings 56. Typically, there are electric circuit components 57 on at least one side of the printed board. For EMI insulating the printed boards 53–55 from each other, Emi gaskets 50 that follow the edge of the printed board are placed compressed on the edge of the outermost printed boards 53, 55 according to the invention. When pressing together the body parts of the cabinet 52, the EMI gaskets 50 form contacts, at close, regular distances with conductive areas located on the surface of the printed boards 53–55 and with the body of the cabinet 52 dividing the cabinet 52 into different kinds of spaces that are EMI insulated from each other.

The parts of the body of the device cabinet 52 can also be shaped so that the recess presented in connection with the second embodiment of the invention is produced in the cabinet, whereupon the EMI gasket 50 can also be installed on the edge of said middle printed board 54, which EMI gasket 50 when the body parts are pressed together presses in said recess against the body parts of the cabinet preventing interfering electromagnetic radiation from penetrating into the device cabinet or out of the device cabinet through the joint between the body parts of the cabinet 52.

Figure 6:
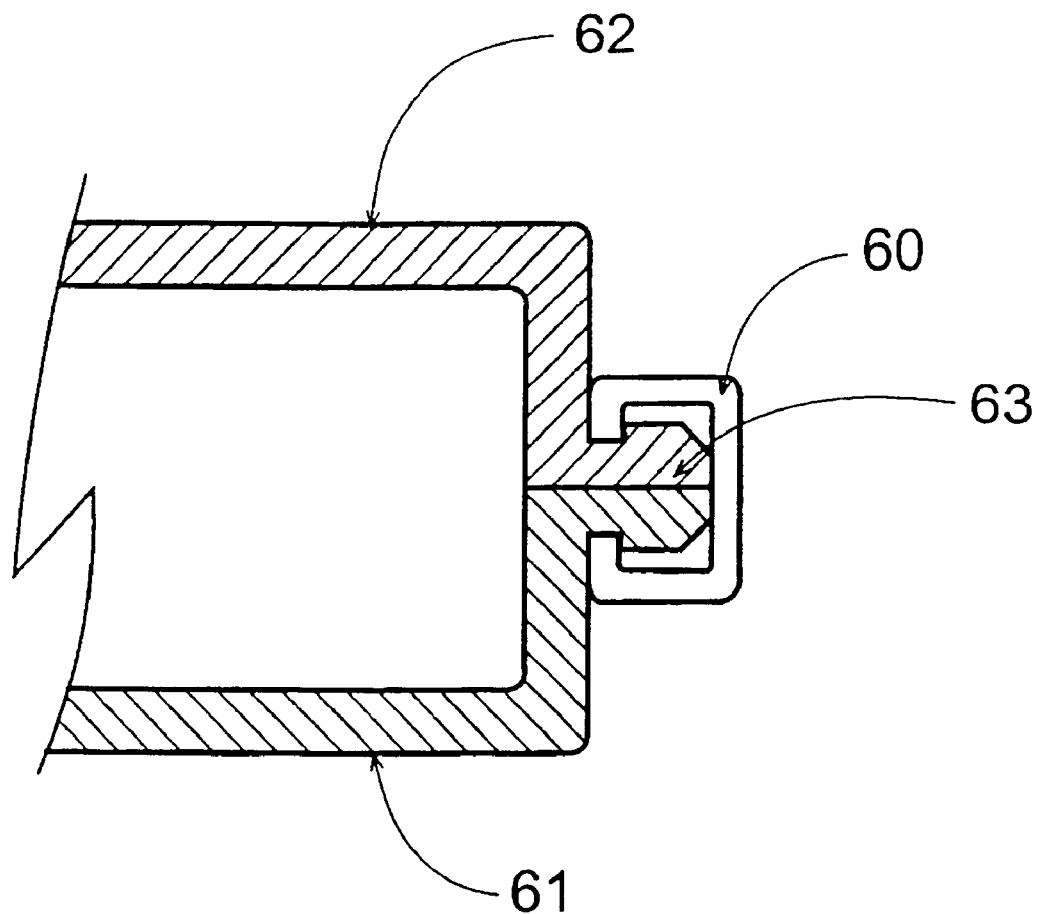
FIG. 6 shows a fourth embodiment of EMI sealing according to the invention.

FIG. 6 shows the fourth embodiment according to the invention, in which an EMI gasket 60 that operates as presented above is installed outside a device cabinet to ensure the EMI tightness of the cabinet. The cabinet comprises a specific first part 61 and a specific second part 62, which are attached together by pressing the EMI gasket 60 in tension on top of a shoulder 63, which shoulder 63 is produced when said parts 61, 62 of the cabinet with suitably shaped edging parts are placed against each other. In this case, said EMI gasket 60, which may have a cross-section in the shape of, e.g. a rectangle opened on one of its sides, contacts with said parts 61, 62 of the device cabinet preventing interfering electromagnetic radiation from penetrating the joint between the cabinet parts. No traditionally used attachment methods, such as screws, are needed for attaching the device cabinet parts 61, 62, but instead the EMI gasket 60 placed in tension on top of the shoulder 63 takes care of the attachment.

The ease of attachment of an EMI gasket according to the invention is one essential advantage of the invention. No gluing is required for the attachment. An edge or a shoulder of a plate, against which the EMI gasket can be pushed, is sufficient for the attachment. The versatility of the EMI gasket is an advantage. An EMI gasket according to the invention can be easily replaced if this is necessary, e.g. with an EMI gasket, which has a diameter of a different size.

This paper presents the implementation and embodiments of the invention with the help of examples. A person skilled in the art will appreciate that the present invention is not restricted to details of the embodiments presented above and that the invention can also be implemented in another form without deviating from the characteristics of the invention. The presented embodiments should be regarded as illustrative but not restricting. Thus, the possibilities of implementing and using the invention are only restricted by the enclosed claims, and the various options of implementing the invention as determined by the claims, including the equivalent implementations, also belong to the scope of the invention.

What is claimed is:

1. An elongated EMI (electromagnetic interference) gasket (20, 50, 60), characterised by the EMI gasket (20, 50, 60) being made from an electroconductive wire bent in a spring-like shape such that the EMI-gasket comprises:
    a longitudinal portion formed by said wire, the portion being parallel to the longitudinal direction of the EMI gasket, and
    a groove substantially parallel to the longitudinal direction of the EMI gasket, the groove being adapted to receive a piece or a part of the piece (23, 34, 43, 53, 55, 63) inside the EMI gasket (20, 50, 60).

2. An EMI gasket according to claim 1, characterised in that the EMI gasket (20, 50, 60) is arranged to touch said piece or the part of the piece (23, 34, 43, 53, 55, 63) with said longitudinal portion.

3. An EMI gasket (20, 50, 60) according to claim 1, characterised by the EMI gasket being manufactured by bending an electroconductive wire so that it forms an elongated element the transversal profile of which being open.

4. An EMI gasket (20, 50) according to claim 3, characterised in that its transversal profile comprises a circular arc.

5. An EMI gasket (60) according to claim 3, characterised in that its transversal profile is a rectangle open on one of its sides.

6. An EMI gasket (50) according to claim 1, characterised in that said groove further comprises a recess (51) opposite to the opening of the groove, walls of the recess being adapted to touch said piece or its part (23, 34, 43, 53, 55, 63).

7. An EMI gasket (20, 50) according to claim 1, characterised in that at least one of the edges that border said groove is adapted to touch said piece or its part (23, 34, 43, 53, 55, 63).

8. An EMI gasket (20, 50) according to claim 1, characterised in that said piece or its part (23, 34, 43, 53, 55) is a partition of a device cabinet or a circuit board.

9. A device that comprises a first part (21, 32, 61) and a second part (22, 31, 62) joined together and an elongated EMI gasket (20, 60) for getting said first part (21, 23, 32, 61) and said second part (22, 31, 62) into contact and for preventing electromagnetic interference from passing through the joining point between the first and the second part, characterised by the EMI gasket (20, 60) being made from an electroconductive wire bent in a spring-like shape such that the EMI gasket (20, 60) comprises:
    a longitudinal portion formed by said wire, the portion being parallel to the longitudinal direction of the EMI gasket, and
    a groove substantially parallel to the longitudinal direction of the EMI gasket, the groove being adapted to receive at least one of said first and second parts (23, 34, 43, 53, 55, 63) inside the EMI gasket, and wherein:
        the EMI gasket (20, 60) is in contact with both said first part and said second part for forming an electrical contact via the EMI gasket between said parts (21, 22; 32, 31; 61, 62).

10. A device according to claim 9, characterised in that the EMI gasket (20) is in between said first part (21, 32) and said second part (22, 31).

11. A device according to claim 9, characterised in that the second part (22, 31) of the device touches an external surface of the EMI gasket (20) and
    the first part (21, 32) of the device is partly inside the EMI gasket (20) and
    said groove is bordered by a first edge, which is in contact with said first part (21, 32), whereupon the EMI gasket forms a contact between said first part (21, 32) and said second part (22, 31) of the device.

12. A device according to claim 9, characterised in that both the first part (61) and the second part (62) of the device are partly inside the EMI gasket (60) and
    said groove is bordered by a first edge and a second edge, which edges are in contact with said first part (61) and said second part (62) of the device respectively, whereupon a contact between said first and second parts is formed, via the EMI gasket (60), externally around the joining point between said first and second parts (61, 62).

13. A device that comprises a first part (41), a second part (42) and a third part (43), joined together, and in between them an elongated EMI gasket (20) made from a conductive wire for getting said parts into contact with each other and for preventing electromagnetic interference from passing through the joining point between said parts (41, 42, 43), characterised by
    the EMI gasket (20) being in contact with said first part (41) and said second part (42) and by
    the EMI gasket (20) being made from an electroconductive wire bent in a spring-like shape such that the EMI gasket (20) comprises:
        a longitudinal portion formed by said wire, the portion being parallel to the longitudinal direction of the EMI gasket, and
        a groove substantially parallel to the longitudinal direction of the EMI gasket, the groove being adapted to receive said third part (43) at least partly inside the EMI gasket (20), and wherein:
            said groove is bordered by a first edge, which is in contact with said third part (43) to form an electrical contact between said first part (41), said second part (42) and said third part (43).

* * * * *